United States Patent
Pallerla et al.

(10) Patent No.: US 11,763,866 B1
(45) Date of Patent: Sep. 19, 2023

(54) SRAM WITH SCAN MODE

(71) Applicant: QUALCOMM Incorporated, San Diego, CA (US)

(72) Inventors: Arun Babu Pallerla, San Diego, CA (US); Anil Chowdary Kota, San Diego, CA (US); Changho Jung, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 46 days.

(21) Appl. No.: 17/702,770

(22) Filed: Mar. 23, 2022

(51) Int. Cl.
*G11C 7/22* (2006.01)
*G11C 7/10* (2006.01)
*G11C 8/08* (2006.01)
*G11C 7/08* (2006.01)
*G11C 7/12* (2006.01)

(52) U.S. Cl.
CPC ............... *G11C 7/222* (2013.01); *G11C 7/08* (2013.01); *G11C 7/1009* (2013.01); *G11C 7/1012* (2013.01); *G11C 7/12* (2013.01); *G11C 8/08* (2013.01)

(58) Field of Classification Search
CPC ......... G11C 7/222; G11C 7/08; G11C 7/1009; G11C 7/1012; G11C 7/12; G11C 8/08
USPC ...................................... 365/230.03
See application file for complete search history.

(56) References Cited

U.S. PATENT DOCUMENTS

2019/0293716 A1   9/2019   Yokoyama
2023/0005556 A1*  1/2023   Sahu ..................... G11C 29/10

OTHER PUBLICATIONS

International Search Report and Written Opinion—PCT/US2023/014898—ISA/EPO—dated May 22, 2023.

* cited by examiner

*Primary Examiner* — Huan Hoang
(74) *Attorney, Agent, or Firm* — Haynes and Boone, LLP (57) ABSTRACT

A memory is provided with a clock circuit configured to simultaneously assert a write multiplexer clock signal and a read multiplexer clock signal during a scan mode of operation. In the scan mode of operation, a scan in signal routes through a write multiplexer to a first bit line while the write multiplexer clock signal is asserted. Similarly, the scan in signal routes from the first bit line through a read multiplexer while the read multiplexer clock signal is asserted.

24 Claims, 7 Drawing Sheets

SRAM WITH SCAN MODE

TECHNICAL FIELD

This application relates to memories, and more particularly to a static random-access memory (SRAM) with a scan mode of operation.

BACKGROUND

In a conventional static random-access memory (SRAM), a bitcell connects to a pair of bit lines through a corresponding pair of access transistors during a read operation. To switch on the access transistors during a read operation, a self-timed clock circuit controls the assertion of the voltage of a word line that connects to a gate of each of the access transistors. The pair of access transistors and corresponding bit lines may thus be treated as a single read port and a single write port to the bitcell. The pair of bit lines are shared by other bitcells and their corresponding access transistors. The resulting group of bitcells linked by their common bit line pair is typically denoted as a column of bitcells. Since there is just one bit line pair for the column, only a single read operation or a single write operation can occur each time the word line is asserted.

To accommodate applications such as video processing that require at least two access ports, triple-port SRAMS have been developed. One processor may then access the triple-port SRAM through a first read access port while another processor accesses the triple-port SRAM through a second read access port. In a triple-port SRAM, each column has a pair of write bit lines for a write operation and two separate read bit lines, one for each read port. Each bitcell may thus have one pair of access transistors for coupling to the write bit lines and have another two additional access transistors, one for each read port. Although such triple-port SRAMs enable simultaneous read/write operations, the extra access transistors for each bitcell produce a lower density (the number of bitcells that can be implemented in a given area of die space).

SUMMARY

In accordance with a first aspect of the disclosure, a memory is provided that includes: a write driver configured to control a binary state of a write driver bit line during a scan mode of operation responsive to a binary state of a scan in signal during a scan mode of operation; a write multiplexer configured to couple the write driver bit line to a first bit line in response to an assertion of a write multiplexer clock signal; a read multiplexer configured to couple the first bit line to a global read bit line in response to an assertion of a read multiplexer clock signal; and a clock circuit configured to assert the write multiplexer clock signal substantially simultaneously with the read multiplexer clock signal during the scan mode of operation.

In accordance with a second aspect of the disclosure, a scan method for a memory is provided that includes: asserting a write multiplexer clock signal while a read multiplexer clock signal is asserted during a scan mode of operation; coupling a scan in signal through a write multiplexer to a first bit line in response to the assertion of the write multiplexer clock signal; and coupling the scan in signal from the first bit line through a read multiplexer to a global read bit line in response to the assertion of the read multiplexer signal.

In accordance with a third aspect of the disclosure, a memory is provided that includes: a first switch configured to couple a write driver bit line to a first bit line in response to an assertion of a write multiplexer clock signal; a global read bit line; a sense amplifier configured to sense a binary state of the first bit line to control a binary state of the global read bit line in response to an assertion of a read multiplexer clock signal; and a clock circuit configured to assert the write multiplexer clock signal substantially simultaneously with the read multiplexer clock signal during a scan mode of operation.

These and additional advantages may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

To provide the flexibility of access of a triple-port memory without incurring the density penalty of more than two access transistors per bitcell, a pseudo-triple-port SRAM is disclosed. In a pseudo-triple-port (PTP) bitcell, a first word line controls a first access transistor coupled to a bit line whereas a second word line controls a second access transistor coupled to a complement bit line. A first read port is thus formed by the bit line and the first access transistor. Similarly, a second read port is formed by the complement bit line and the second access transistor. Both bit lines and both access transistor form a write port. Read and write accesses are synchronized by a memory clock signal in a "double pumped" fashion such that a read operation occurs to a bitcell during a first portion of a cycle of the memory clock signal whereas a write operation occurs during a second portion of the cycle of the memory clock signal.

During a read operation, a read multiplexer selects for the bit line being accessed. Similarly, a write multiplexer selects for the bit line pair being accessed during a write operation. During the read operation, the write multiplexer is inactive so that it does not interfere with the write operation. Similarly, the read multiplexer is inactive during the write operation. The read and write multiplexers along with associated components such as a write driver and a sense amplifier form what may be denoted as peripheral logic for the memory. But the mutually exclusive operation of the read and write multiplexers complicates the implementation of a scan mode of operation to test the peripheral logic. If the scan mode takes place during the first portion of a memory clock cycle, the write multiplexer is inactive whereas the read multiplexer is inactive during the second portion of the memory clock cycle. It is thus conventional that the scan mode of operation bypasses both the write multiplexer and the read multiplexer in a pseudo-triple-port SRAM.

Figure 1:
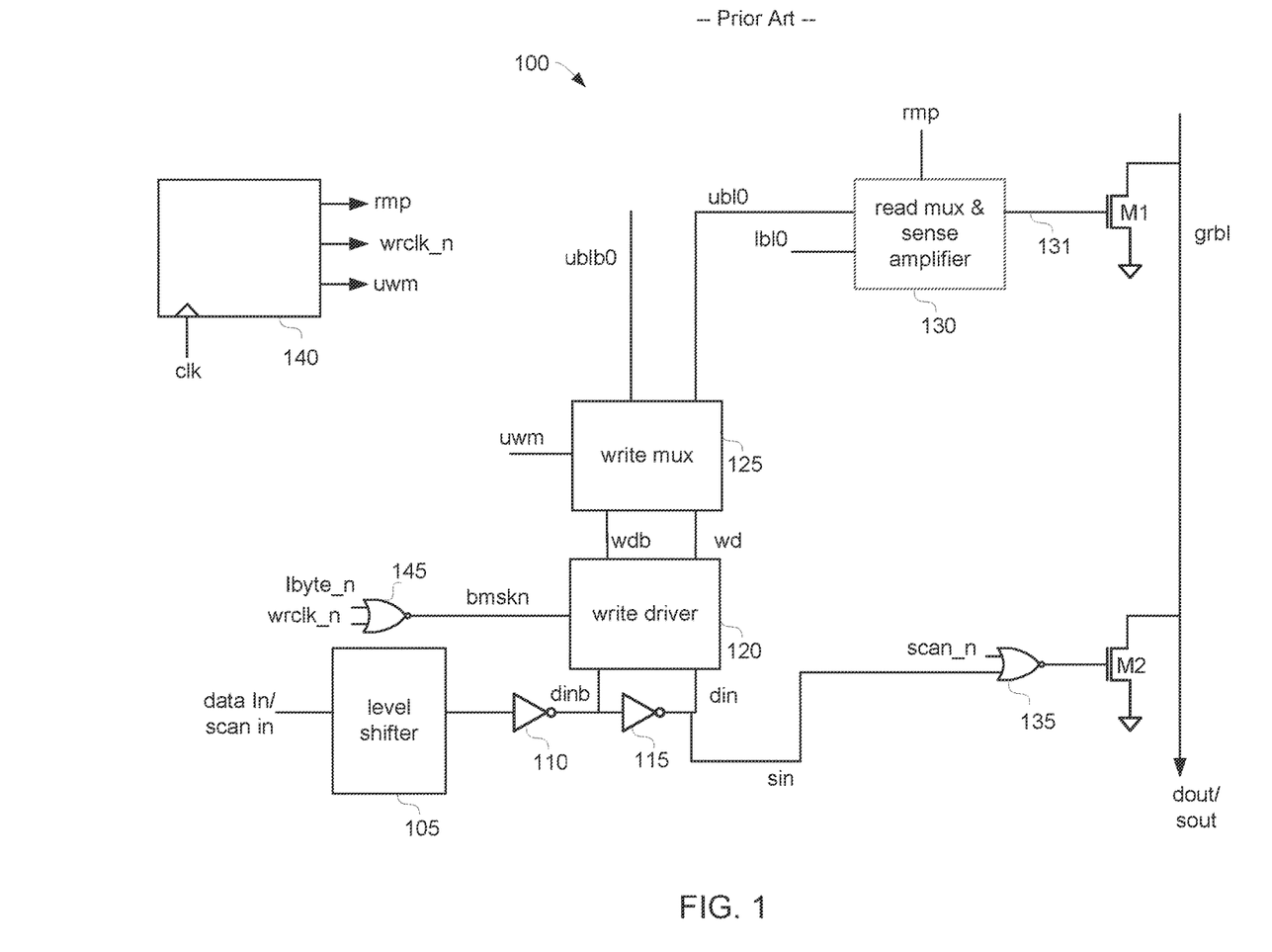
FIG. 1 illustrates a PTP SRAM in which the scan path bypasses the write and read multiplexers.

A pseudo-triple-port (PTP) SRAM is thus disclosed with a scan mode of operation that scans the peripheral logic including the read and write multiplexers. To provide a better appreciation of this innovative scan mode of operation, another scan mode of operation for a PTP SRAM 100 as shown in FIG. 1 will first be discussed. A system component such as a processor (not illustrated) generates a data in signal for a write operation. The processor is within a system power domain powered by a system power supply voltage whereas PTP SRAM 100 is in a memory power domain powered by a memory power supply voltage. The data in signal is thus level shifted from the system power domain to the memory power domain by a lever-shifter 105. A first inverter 110 inverts the level-shifted output of level-shifter 105 to form a complement data input signal dinb. A second inverter 115 inverts the complement data input signal dinb to form a data input signal din.

During a write operation, a write driver 120 drives a write driver bit line wd responsive to the data input signal din assuming that a bit mask signal ibyte_n is not asserted. Should the bit mask signal ibyte_n signal be asserted, write driver 120 does not respond to the data input signal din. Write driver 120 also drives a complement write driver bit line wdb responsive to the complement data input signal dinb (again assuming that the bit mask signal ibyte_n is not asserted). A write multiplexer (mux) 125 couples the write driver bit line wd to a memory bank bit line ubl0 in response to an assertion of a write multiplexer clock signal uwm. Similarly, write multiplexer 125 couples the complement write driver bit line wdb to a memory bank complement bit line ublb0 in response to the assertion of the write multiplexer clock signal uwm. Bit lines ubl0 and ublb0 form a bit line pair.

Prior to the write operation, the bit line pair ubl0 and ublb0 were pre-charged to the memory power supply voltage. Should the data input signal dinb be a binary one value (assuming an active high implementation), the bit line ubl0 remains charged whereas the complement bit line ublb0 is discharged. Conversely, the bit line ubl0 is discharged whereas the complement bit line ublb0 remains charged if the data input signal dinb is a binary zero value. Based upon the complementary charged state of the bit line pair ubl0 and ublb0, an accessed PTP bitcell (not illustrated) is written to accordingly. Bit lines ubl0 and ublb0 and the corresponding PTP bitcells form a column in an upper bank (not illustrated) in PTP SRAM 100. A bank is an array of columns and corresponding bitcells.

The pair of bit lines ubl0 and ublb0 are both driven by write driver 120 through write multiplexer 125 during a write operation. But each bit line forms its own read port during a read operation. In PTP SRAM 100, a read multiplexer (mux) and a sense amplifier 130 are combined. Depending upon an active-low assertion of a read multiplexer clock signal rmp, read multiplexer and sense amplifier 130 is either powered or not. If powered as controlled by the read multiplexer clock signal rmp, read column multiplexer and sense amplifier 130 senses both the bit line ubl0 and a corresponding bit line lbl0 from a lower bank (not illustrated).

As defined herein, a binary signal is deemed to be "asserted" when that signal is logically true, regardless of whether the logical true state is represented using an active-high or an active-low convention. Since the read multiplexer clock signal rmp is an active-low signal, it is thus asserted by being discharged to ground. In contrast, should the read multiplexer clock signal rmp be an active-high signal, it would be asserted by being charged to the memory power supply voltage.

Should the read multiplexer address signal rmp be asserted and the bit line ubl0 remains charged during a read operation due to the accessed PTP bitcell storing a binary one bit, read column multiplexer and sense amplifier 130 functions to discharge its output signal 131 to ground. Output signal 131 drives a gate of an n-type metal-oxide-semiconductor (NMOS) transistor M1 having a source coupled to ground and a drain coupled to a global read bit line grbl.

The global read bit line grbl is part of the system power domain. Prior to the read operation, a pre-charge of the global read bit line grbl thus pre-charges it to the system power supply voltage. The discharged state of output signal 131 keeps transistor M1 from switching on so that the global read bit line grbl remains charged. But if the accessed PTP bitcell were storing a binary zero, bit line ubl0 would discharge during the read operation such that output signal 131 would be asserted to the memory power supply voltage when the read multiplexer clock signal rmp is asserted. The global read bit line grbl would then discharge towards ground due to the high state of output signal 131. A global data output latch (not illustrated) latches the state of the global read bit line grbl as a data out (dout) signal during the read operation.

Figure 2:
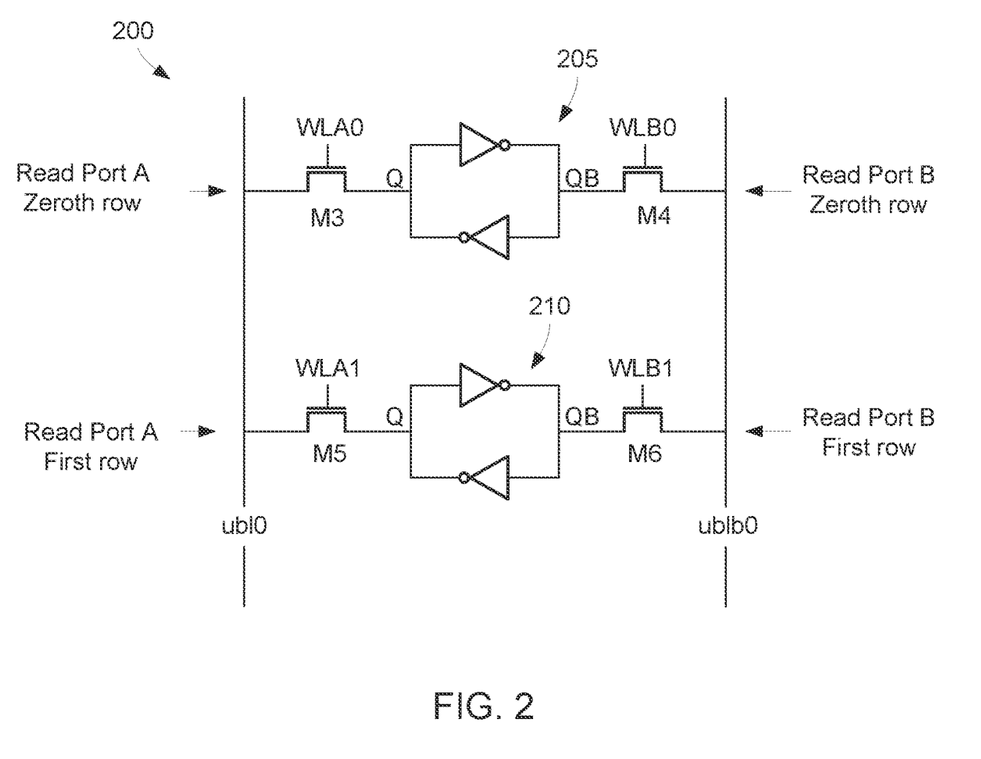
FIG. 2 illustrates a bitcell for a PTP SRAM in accordance with an aspect of the disclosure.

An example column 200 for a PTP SRAM as disclosed herein is shown in FIG. 2. Column 200 includes a first PTP bitcell 205 and a second PTP bitcell 210, but it will be appreciated that column 200 may include additional PTP bitcells that are not shown for illustration clarity. Each PTP bitcell is within its own row of other bitcells (not illustrated) that share a corresponding pair of word lines. For example, PTP bitcell 205 is arranged in a zeroth row of bitcells. Similarly, PTP bitcell 210 is in a first row of bitcells. Each PTP bitcell includes a cross-coupled pair of inverters that drives a true bit node Q and a complement bit node QB.

A bit line pair formed by a bit line ubl0 and complement bit line ublb0 extends across column 200. A read port A word line WLA0 extends across the zeroth row and drives a first n-type metal-oxide semiconductor (NMOS) access transistor M3 in PTP bitcell 205 that couples between the true bit node Q of PTP bitcell 205 and the bit line ubl0. The read port A word line WLA0 similarly drives other first access transistors in the remaining PTP bitcells (not illustrated) in the zeroth row. A read port B word line WLB0 also extends across the zeroth row and drives a second NMOS access transistor M4 that couples between the complement bit node QB of PTP bitcell 205 and complement bit line ublb0. The read port B word line WLB0 similarly drives other second access transistors (not illustrated) in the zeroth row. Since the word lines are controlled independently during a read operation, the combination of the bit line ubl0, the read port A word line WLA0 , and the access transistor M3 form a read port A for PTP bitcell 205. The bit line ubl0 may thus also be denoted as the read port A bit line. Similarly, the combination of the complement bit line ublb0, the read port B word line WLB0, and the access transistor M4 form a read port B for bitcell 205. The complement bit line ublb0 may thus also be denoted as a read port B bit line.

The word line pair for the first row of bitcells is analogous. For example. a read port A word line WLA1 in the word line pair extends across the first row to drive an access transistor M5 in PTP bitcell 210. The read port A word line WLA1 similarly drives other first access transistors in the remaining bitcells (not illustrated) in the first row. A read port B word line WLB1 extends across the first row to drive an access transistor M6 in PTP bitcell 210. The read port B word line WLB1 similarly drives other second access transistors (not illustrated) in the first row. PTP bitcell 210 thus has a read port A from a combination of its access transistor M5, the bit line ubl0, and the read port A word line WLA1. Similarly, PTP bitcell 210 has a read port B from a combination of its access transistor M6, the complement bit line ublb0 and the read port B word line WLB1.

Suppose that read port A is accessed in PTP bitcell 205 through an assertion of a voltage for the word line WLA0. Since access transistor M3 couples between the bit node Q of PTP bitcell 205, the voltage of bit line ublb0 will be charged accordingly to the binary contents of PTP bitcell 205 when the voltage of the read port A word line WLA0 is asserted. If PTP bitcell 205 is storing a binary one in a binary-high convention, the bit node Q of PTP bitcell 205 will thus be charged to the memory power supply voltage. Prior to the read operation, the bit line ubl0 is precharged to the memory power supply voltage. During the read operation to read port A, the bit line ubl0 will thus remain charged to the memory power supply voltage when PTP bitcell 205 is storing a binary one. But if PTP bitcell 205 had been storing a binary zero, the read operation to read port A would cause the bit line ubl0 to be discharged towards ground while the access transistor M3 is switched on.

Figure 3:
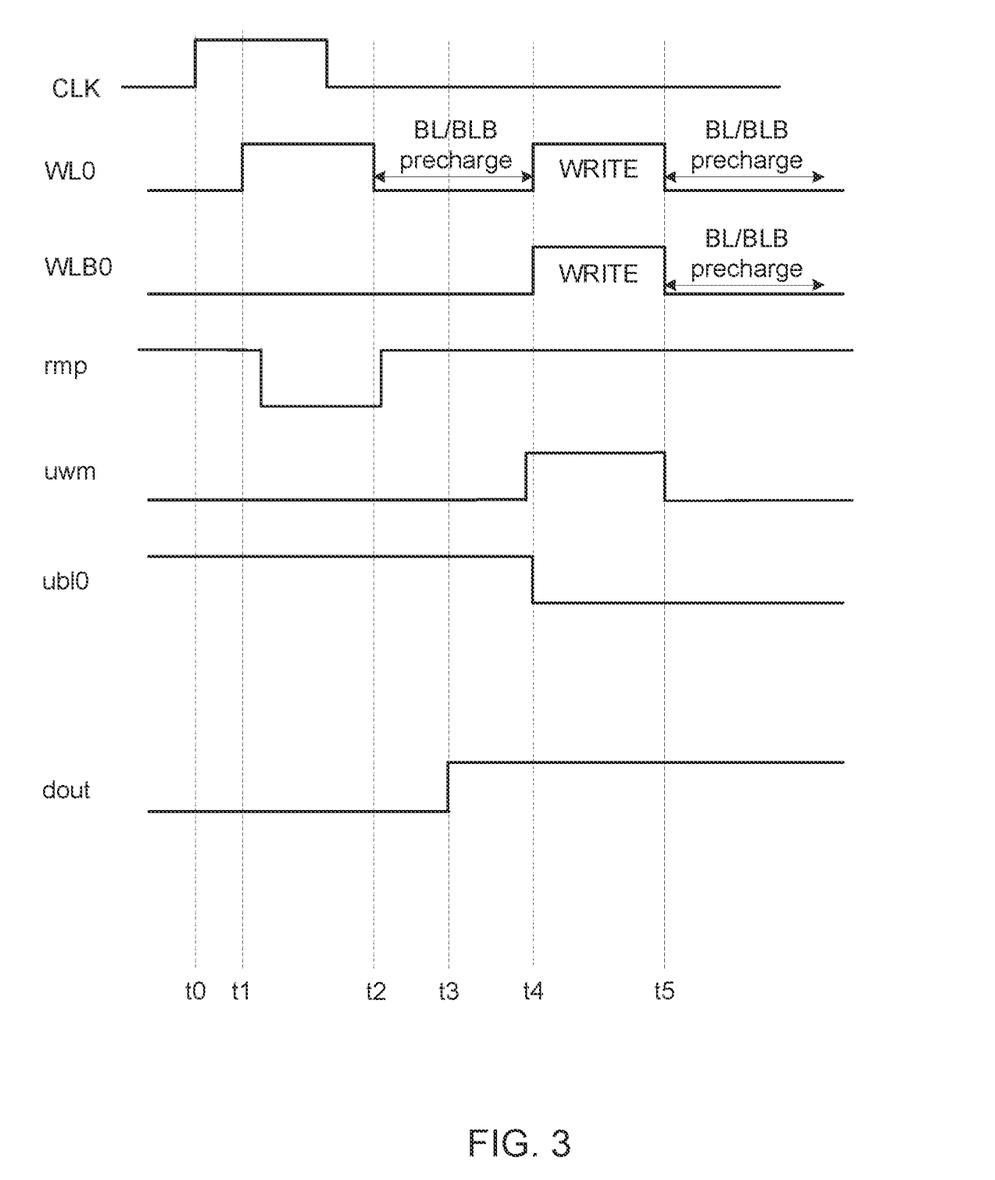
FIG. 3 is a timing diagram for various signals during a functional mode read and write operation in the PTP SRAM of FIG. 1.

Some example waveforms for such a read operation to PTP bitcell 205 are shown in FIG. 3. Prior to an assertion of a memory clock signal CLK at a time t0, the bit line ubl0 is charged to the memory power supply voltage. The assertion of the memory clock signal at time t0 triggers a read cycle followed by a write cycle in one period of the memory clock signal CLK. From a time t1 to a time t2, the read port A word line WLA0 for the zeroth row is asserted. There is thus a read port A access from time t1 to time 2 to bitcell 205. With the word line voltage developed, the read multiplexer clock signal rmp is then asserted. In this implementation, the read multiplexer clock signal rmp is an active-low signal so it is asserted by being discharged to ground. In this example, it is assumed that PTP bitcell 205 is storing a binary one bit such that the bit node Q of PTP bitcell 205 is charged to the power supply voltage. Bit line ubl0 thus remains charged to the power supply voltage during the word line assertion period from time t1 to time t2. Note that during the same word line assertion period from time t1 to time 2, the read port B word line WLB1 for the first row (not shown in FIG. 3) may also be asserted to perform a read port B access to PTP bitcell 210.

Since a read access through one of the bit lines in the bit line pair does not use the voltage of the remaining bit line, the resulting read operation is single-ended. Referring again to PTP SRAM, an access to such a read port A then causes the global read bit line grbl of SRAM 100 (FIG. 1) to remain charged to the system power supply voltage. As shown in FIG. 3, the data out signal dout is then charged high at a time t3.

With the read operation completed, the read multiplexer clock signal rmp is de-asserted following after time t2. A write pre-charge period extends from time t2 to a time t4. In some implementations, a pre-charge circuit charges the bit line ubl0 and the complement bit line ublb0 to the memory power supply voltage during the write pre-charge period. Thus, the bit line ubl0 is shown in FIG. 3 as remaining charged to the memory power supply voltage during the write pre-charge period.

A write port access then occurs from time t4 to a time t5 to PTP bitcell 205. At or before time t4, write driver 120 (FIG. 1) couples the bit line ubl0 to the write driver bit line wd. Similarly, write driver 120 couples the complement bit line ublb0 to the complement write driver bit line wdb. To allow write driver 120 to be responsive to a byte mask command ibyte_n, a logic gate such as a NOR gate 145 as shown in FIG. 1 processes the bit mask command with an active-low write clock signal wrclk_n. If the accessed bitcell in the write operation is to be masked as part of a masked byte, the byte mask command signal ibyte_n is asserted to a logic one binary value, which causes an output signal bmsk_n of NOR gate 145 to be a logic zero. Should the byte mask command ibyte_n be a logic zero, NOR gate 145 functions to invert an active-low write clock signal wrclk_n to form the output signal bmsk_n. During a write operation without byte masking, the write clock signal wrclk_n signal is grounded so that the output signal bmsk_n is a logic one. Write driver 120 is configured to couple the bit line ubl0 to the write driver bit line wd only when bmsk_n is a logic one. It will be assumed in the following discussion for PTP SRAM 100 that bmsk_n is asserted to a logic 1 value. In this example, the write driver bit line wd is discharged in response to the data input signal din also being discharged. A binary state of the complement write driver bit line wdb is thus a binary one. With write driver 120 charging the bit line pair accordingly, a self-timed clock circuit 140 controls the assertion of word line WLA0 and word line WLB0 from time t4 to time t5 to write the data input signal din to PTP bitcell 205. Access transistor M3 and access transistor M4 are both switched on due to the simultaneous word line assertion during the write port access.

Since the write driver bit line wd is discharged in this example, the bit line ubl0 is thus discharged during the write port access from time t4 to time t5. The word line assertion period from time t4 to time t5 has a sufficient length so that the data input signal din (in this example, a binary zero) is written into the accessed bitcell. As shown in FIG. 3, the write multiplexer clock signal uwm is asserted prior to time t4 so that the bit line voltages may be driven accordingly when the word lines are asserted at time t4. In this implementation, the write multiplexer clock signal uwm is an active-high signal so that it is charged to the memory power supply voltage. With the release of the word line at time t5, the write multiplexer clock signal uwm may also be released.

During the read operation, the write multiplexer clock signal uwm is de-asserted so that the write column multiplexer 125 is inactive. In this fashion, the write driver 120 is prevented from undesirably affecting the read operation. Similarly, the read multiplexer address signal rmp is de-asserted by being charged to the memory power supply voltage during the write operation to keep read column multiplexer and sense amplifier 130 powered down so that the global read bit line grbl is undisturbed during the write operation.

Self-timed clock circuit 140 controls the complementary assertions of the write multiplexer address signal uwm and the read multiplexer address signal responsive to cycles of the memory clock (clk) signal. In addition, self-timed clock circuit 140 controls the discharge of the write clock signal wrclk_n to open write driver 120. Self-timed clock circuit 140 includes various elements such as a dummy word line and a dummy bit line so that the electrical behavior of the actual word lines and bit lines may be mimicked. The complementary assertion of the read multiplexer clock signal rmp and the write multiplexer clock signal uwm by self-timed clock circuit 140 prevents a scan mode of operation from scanning through the peripheral logic including write driver 120, write column multiplexer 125 and read column multiplexer and sense amplifier 130. For example, the read column multiplexer and sense amplifier 130 is active and can be scanned while the read multiplexer clock signal rmp is asserted. But then the write column multiplexer 125 is closed due to the complementary de-assertion of the write multiplexer clock signal uwm. Similarly, the write column multiplexer 125 is open and can be scanned while the write multiplexer clock signal uwm is asserted but then read column multiplexer and sense amplifier 130 is powered down due to the complementary de-assertion of the read multiplexer clock signal rmp.

PTP SRAM 100 includes a bypass scan logic circuit such as a NOR gate 135 that responds to an assertion of a scan mode control signal (scan_n) so as to bypass the write driver 120, write column multiplexer 125, and read column multiplexer and sense amplifier 130 during a scan mode of operation. In the scan mode of operation, level-shifter 105 level shifts a scan in signal instead of the data in signal to form a level-shifted scan in signal (sin). NOR gate 135 NORs the level-shifted scan in signal sin with the scan mode control signal scan_n to control whether an NMOS transistor M2 conducts to discharge the global read bit line grbl. In this implementation, the scan mode control signal scan_n is an active-low signal. Transistor M2 has a source coupled to ground and a drain coupled to the global read bit line grbl. During a functional mode (non-scan) mode of operation, the scan mode control signal scan_n is charged to the memory power supply voltage so that NOR gate 135 discharges the gate of transistor M2. Transistor M2 thus is off during the functional mode of operation so as to not disturb any read operation. During the scan mode of operation, the scan mode control signal scan_n is asserted by being discharged (scan_n being an active-low signal). NOR gate 135 can then respond to the level-shifted scan in signal sin. Should the level-shifted scan in signal sin be binary high, NOR gate 135 continues to discharge the gate of transistor M2. Since the global read bit line grbl is pre-charged prior to receipt of the level-shifted scan in signal sin, the global read bit line grbl remains charged to the system power supply voltage should the level-shifted scan in signal sin be binary high. During the scan mode of operation, the global read bit line grbl voltage determines the binary state of a scan out (sout) signal. The sout signal will thus be a binary high signal in response to the binary high state of the level-shifted scan in signal sin. But if the level-shifted scan in signal sin is a binary low signal (discharged to ground), NOR gate 135 switches on transistor M2 to discharge the sout signal. Although the level-shifted scan in signal sin may then be passed as the sout signal, the resulting scan completely bypasses the write driver 120, write column multiplexer 125, and read column multiplexer and sense amplifier 130 during the scan mode of operation. Such a PTP scan thus cannot detect errors in the operation of these peripheral logic components. A PTP SRAM with an improved scan mode that scans the peripheral logic components will now be discussed in more detail.

Figure 4:
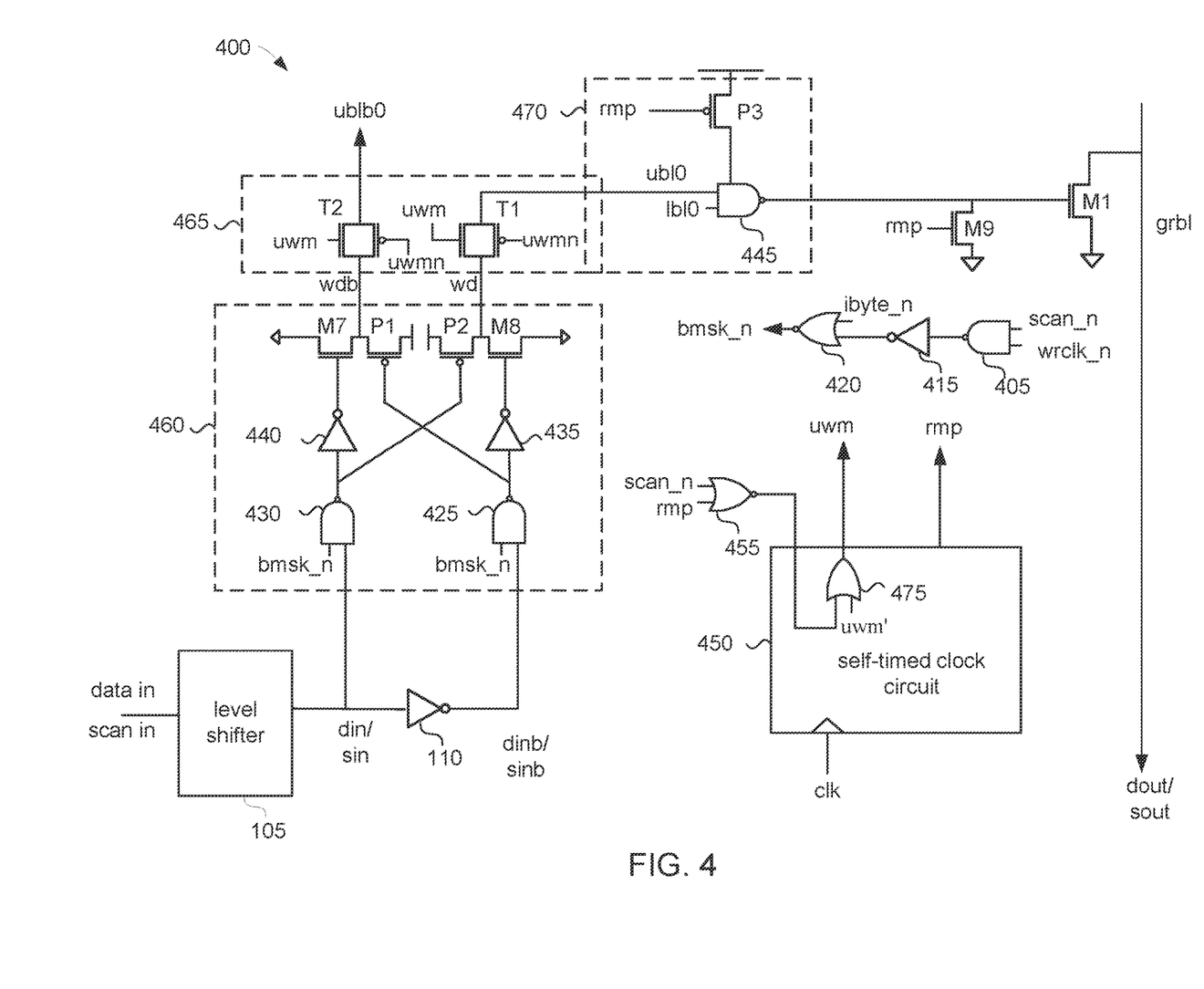
FIG. 4 illustrates a PTP SRAM in which the scan path passes through the peripheral logic including the write and read multiplexers in accordance with an aspect of the disclosure.

To provide an in-depth scan of the peripheral logic components, an SRAM is disclosed with a scan mode of operation that scans the peripheral logic including the write driver, the write column multiplexer, and the read column multiplexer. The following discussion will be directed to a PTP SRAM having this improved scan mode of operation but it will be appreciated that other types of six-transistor-bitcell SRAMs such as a single-port SRAM that incorporates both a read multiplexer and a write multiplexer may also implement the disclosed scan mode of operation. In a PTP SRAM, the PTP bitcells may be implemented as discussed for PTP bitcells 205 and 210. Similarly, the timing of the read multiplexer clock signal rmp assertion and the timing of the write multiplexer clock uwm assertion during the functional mode may be performed as discussed for FIG. 3. An example PTP SRAM 400 with this robust peripheral logic scan capability is shown in FIG. 4. As discussed for PTP SRAM 100, level-shifter 105 functions to level shift the data in signal from the system power domain to the memory power domain to form the level-shifted din signal during the functional mode of operation. Similarly, level-shifter 105 level shifts the scan in signal to form the level-shifted scan in signal (sin) during the scan mode of operation. During the functional mode of operation, an inverter 110 inverts the level-shifted din signal to form a level-shifted complement data in signal (dinb). Similarly, inverter 110 inverts the level-shifted scan in signal sin during the scan mode of operation to form a level-shifted complement scan in signal (sinb).

A scan mode controller (not illustrated) controls whether the scan mode of operation is active by discharging an active-low scan mode control signal scan_n. The following description will focus on the scan mode of operation. To force a write driver 460 to be transparent (active or open) during the scan mode of operation, a logic gate such as a NAND gate 405 processes the scan mode control signal scan_n with the write clock signal wrclk_n. With the scan_n signal being a logical zero in the scan mode of operation, an output signal of NAND gate 405 is forced to a logical one. An inverter 415 then inverts the output signal of NAND gate 405 to output a logical zero signal. A NOR gate 420 NORs the output signal of inverter 415 with the byte mask signal ibyte_n to form the bmsk_n signal. During the scan mode of operation, the byte mask signal ibyte_n is a logical zero. Thus, the bmsk_n signal is asserted to a logic one when the scan_n signal is a logic zero to force write driver 460 to be operative.

In one implementation, write driver 460 includes a NAND gate 430 that NANDS the level-shifted scan in signal sin with the bmsk_n signal. With the bmsk_n signal asserted to a logic one value during the scan mode of operation because of the discharge of the scan mode control signal scan_n, NAND gate 430 functions as an inverter to drive a gate of a p-type metal-oxide-semiconductor (PMOS) transistor P2 having a source coupled to a power supply node for the memory power supply voltage and having a drain coupled to the write driver bit line wd. If the level-shifted scan in signal sin is a binary one, transistor P2 switches on in response to the binary low output signal of NAND gate 430 to charge the write driver bit line wd to the power supply voltage.

An inverter 440 inverts the output signal of NAND gate 430 to drive a gate of an NMOS transistor M7 having a source coupled to ground and a drain coupled to the complement write driver bit line wdb. If the level-shifted scan in signal sin is a binary one, the output signal of inverter 440 will be asserted to a binary one also. Transistor M7 is then switched on to discharge the complement write driver bit line wdb accordingly. Conversely, if the level-shifted scan in signal sin is a binary zero, the output signal from NAND gate 430 is a binary one, which forces transistor P2 off so that it cannot affect the charge of the write driver bit line wd. Similarly, the binary high state of the output signal from NAND gate 430 is inverted by inverter 440, which also forces transistor M7 to be off so that it cannot affect the charge of the complement write driver bit line wd.

Write driver 460 may also include a NAND gate 425 that NANDS the level-shifted complement scan in signal sinb with the bmsk_n signal. With the bmsk_n signal asserted to a logic one value during the scan mode of operation because of the discharge of the scan_n signal, NAND gate 425 functions as an inverter to drive a gate of a PMOS transistor P1 having a source coupled to the power supply node for the memory power supply voltage and having a drain coupled to the complement write driver bit line wdb. If the level-shifted complement scan in signal sinb is a binary one, transistor P1 switches on in response to the binary low output signal of NAND gate 425 to charge the complement write driver bit line wdb to the memory power supply voltage.

An inverter 435 inverts the output signal of NAND gate 425 to drive a gate of an NMOS transistor M8 having a source coupled to ground and a drain coupled to the write driver bit line wd. If the level-shifted complement scan in signal sinb is a binary one, the output signal of inverter 435 will be asserted to a binary one also. Transistor M8 is then switched on to discharge the write driver bit line wd accordingly. Conversely, if the level-shifted complement scan in signal sinb is a binary zero, the output signal from NAND gate 425 is a binary one, which forces transistor P1 off so that it cannot affect the charge of the write driver bit line wd. Similarly, the binary high state of the output signal from NAND gate 425 is inverted by inverter 435, which also forces transistor M8 to be off so that it cannot affect the charge of the complement write driver bit line wd.

Write driver 460 thus responds to the level-shifted scan in signal sin so that write driver bit lines wd and wdb are charged accordingly. If the level-shifted scan in signal sin is a binary one signal, write driver 460 discharges the complement write driver bit line wdb and charges the write driver bit line wd to the memory power supply voltage. Conversely, if the level-shifted scan in signal sin is a binary zero signal, write driver 460 discharges the write driver bit line wd and charges the complement write driver bit line wdb to the memory power supply voltage.

For the timing of the read multiplexer clock signal rmp, it has already been described how self-timed clock circuit 140 of PTP SRAM 100 asserts the read multiplexer clock signal rmp from approximately time t1 to approximately time t2 of FIG. 3. Similarly, self-timed clock circuit 140 asserts the write multiplexer clock signal uwm from time t4 to time t5. This "double pumped" timing may be retained by a self-timed clock circuit 450 of PTP SRAM 400 with respect to read multiplexer clock signal rmp and a write multiplexer clock signal uwm'. To activate a write multiplexer 465 during the scan mode of operation while the read multiplexer clock signal rmp is asserted, self-timed clock circuit 450 may include a logic gate such as a NOR gate 455 (shown separately from self-timed clock circuit 450 for illustration clarity). It will be appreciated that the logic circuits disclosed herein such as NOR gate 455 are merely exemplary in that other types of logic gates (or combinations of logic gates) may be used in alternative implementations. NOR gate 455 NORs the read multiplexer clock signal rmp with the active-low scan mode control signal scan_n that is asserted by being grounded to activate the scan mode of operation. Self-timed clock circuit 450 includes a logic gate such as an OR gate 475 that ORs an output signal of NOR gate 455 with the write multiplexer clock signal uwm' to control a binary state of the write multiplexer clock signal uwm. The write multiplexer clock signal uwm will thus be asserted to the memory power supply voltage substantially simultaneously with the active-low assertion of the read multiplexer clock signal rmp. During a functional mode of operation, self-timed clock circuit 450 may control the read and write multiplexer clock signals rmp and uwm in the "double-pumped" fashion discussed with regard to FIG. 3 so that the read multiplexer clock signal rmp is asserted during a first portion of the memory clock signal (clk) and so that the write multiplexer clock signal uwm is asserted during a second portion of the memory clock signal. Note that NOR gate 455 is powered down during a write operation in the functional mode so that it does not interfere with the write cycle timing. Similarly, the active-low scan mode control signal scan_n is charged to the memory power supply voltage during the functional mode so that the output signal of NOR gate 455 is discharged during a functional mode read operation so as to again not interfere with the write cycle timing.

Write multiplexer 465 includes a first switch such as a first transmission gate T1 that conducts in response to the assertion of the write multiplexer clock signal uwm (and the active-low assertion of a complement write multiplexer clock signal uwmn that is formed by an inversion of the write multiplexer clock signal uwm). With transmission gate T1 being open (conductive), the write driver bit line wd is coupled to a zeroth upper bank bit line ubl0. In this fashion, the zeroth upper bank bit line ubl0 will be driven to the same binary stage of the level-shifted scan in signal sin. Similarly, write multiplexer 465 includes a second transmission gate T2 that when open couples the complement write driver bit line wdb to a zeroth upper bank complement bit line ublb0. Transmission gate T2 opens in response to the assertion of the write multiplexer clock signal uwm and the active-low assertion of the complement write multiplexer clock signal uwmn.

A combined read multiplexer and sense amplifier 470 includes a NAND gate 445 that NANDs the zeroth upper bank bit line ubl0 and a corresponding zeroth lower bank bit line lbl0. NAND gate 445 is powered through a PMOS transistor P3 that is switched on in response to the active-low assertion of the read multiplexer clock signal rmp. A drain of transistor P3 couples to a power supply node of NAND gate 445 whereas a source of transistor P3 couples to a power supply node for the memory power supply voltage. The read multiplexer clock signal rmp drives a gate of transistor P3 to control whether transistor P3 powers NAND gate 445. As discussed earlier, a bank is a contiguous array of bit cells. The lower bank is not illustrated for illustration clarity. Prior to the receipt of the level-shifted scan in signal sin, the bit lines in the upper and lower banks are pre-charged to the memory power supply voltage. Similarly, the global read bit line grbl is also pre-charged to the system power supply voltage. Should the level-shifted scan in signal sin be charged to the memory power supply voltage during the scan mode of operation, the zeroth upper bank bit line ubl0 will remain charged to the memory power supply voltage so that the output signal of NAND gate 445 will be discharged to ground. The output signal of NAND gate 445 controls a gate of NMOS transistor M1 discussed for PTP SRAM 100. The global read bit line grbl will thus remain charged to the system power supply voltage in response to the high state of the level-shifted scan in signal sin. But if the level-shifted scan in signal sin is a binary zero, the output signal of NAND gate 445 will charged to the memory power supply voltage in response to the active-low assertion of the read multiplexer clock signal rmp. Transistor M1 is then switched on so that the global read bit line grbl is discharged to ground accordingly. To keep transistor M1 off while the active-low read multiplexer clock signal rmp is de-asserted by being charged to the power supply voltage, the read multiplexer clock signal rmp also drives a gate of an NMOS transistor M9 having a drain coupled to the gate of transistor M1 and a source coupled to ground. Transistor M9 is thus switched on while the read multiplexer clock signal rmp is charged to the power supply voltage to keep transistor M1 off. An analogous read multiplexer and sense amplifier (not illustrated) to read multiplexer and sense amplifier 470 couples to zeroth upper bank complement bit line ublb0 to control a binary state of a complement global read bit line (not illustrated).

Consider the advantages of the peripheral logic scan of PTP SRAM 400. Not only are the peripheral logic components such as write driver 460, write multiplexer 465, and read multiplexer and sense amplifier 470 able to be fully scanned but the clock margin is essentially the same as during the functional mode. In contrast, the bypass scan through NOR gate 135 and transistor M2 has a very different clock margin as compared to that achieved by PTP SRAM 100 during the functional mode. In addition, the peripheral logic scan of PTP SRAM 400 does not add any significant loading to the global read bit line grbl. In contrast, transistor M2 adds to the loading of the global read bit line grbl in PTP SRAM 100.

Figure 5:
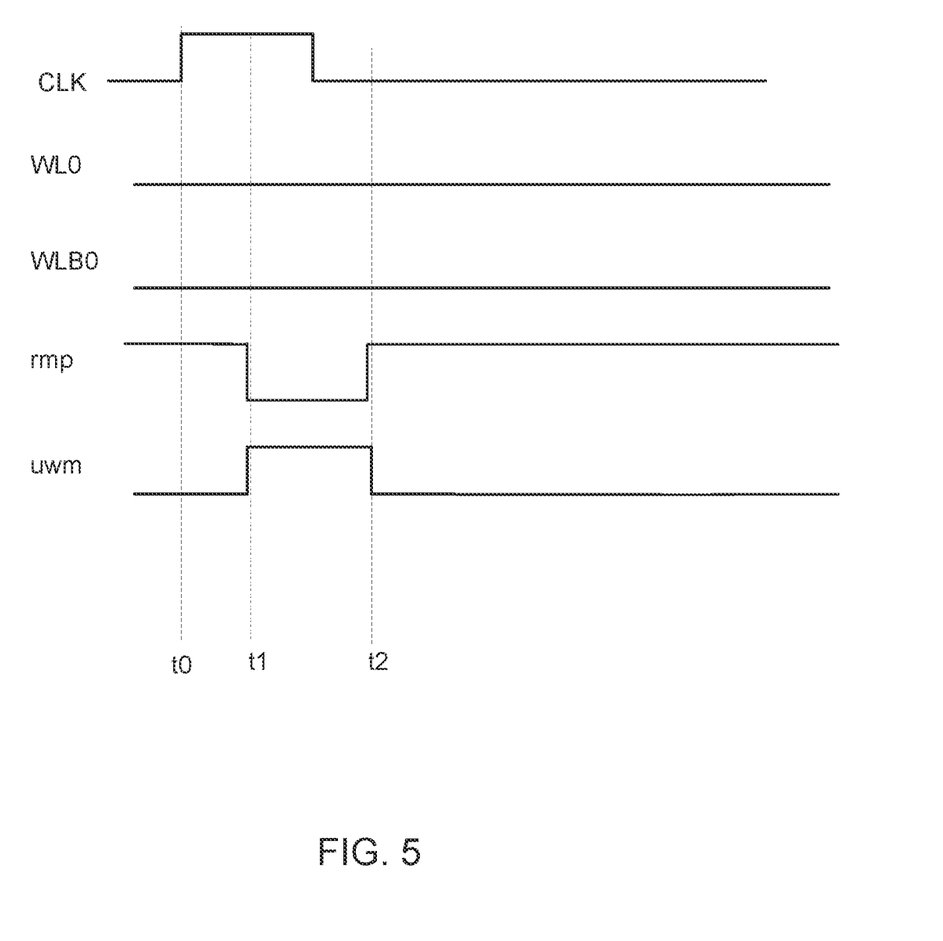
FIG. 5 is a timing diagram for various signals during a scan mode of operation in a PTP SRAM in accordance with an aspect of the disclosure.

Some example waveforms for the peripheral logic scan in PTP SRAM 400 are shown in FIG. 5. In the scan mode of operation, the word lines WL0 and WLB0 to bitcell 205 remain discharged. The assertion of the memory clock signal at time t0 triggers self-timed clock circuit 450 to discharge the active-low read multiplexer clock signal from a time t1 to a time t2 as would be performed during a read operation in the functional mode. In addition, self-timed clock circuit 450 also asserts the write multiplexer clock signal uwm from time t1 to time t2 as well. In contrast, self-timed clock circuit 440 only asserts the write multiplexer clock signal uwm during the write operation portion of the memory clock cycle in the functional mode.

Referring again to PTP SRAM 400, self-timed clock circuit 450 is configured to control the word lines WLA0 and WLB0 for the zeroth row bitcell 205 as discussed for the timing waveforms of FIG. 3. In a read access to port A, self-timed clock circuit 450 controls the word lines so that only word line WLA0 is charged to the memory power supply voltage whereas word line WLB0 would remain discharged. During the read access to port A of zeroth row bitcell 205, self-timed clock circuit 450 may control the word lines in a read access to port B so that only word line WLB1 is charged to the memory power supply voltage whereas word line WLA1 would remain discharged.

Figure 6:
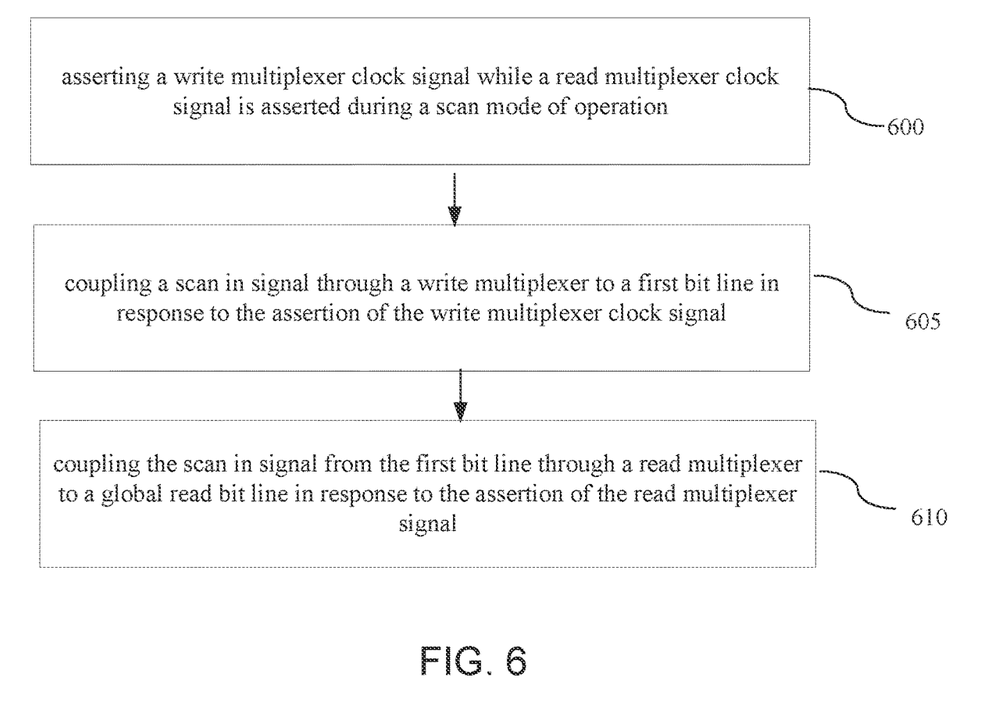
FIG. 6 is a flowchart for an example method of operation for a pseudo-triple-port memory peripheral logic scan in accordance with an aspect of the disclosure.

A method of operation for a peripheral logic scan in a PTP memory will now be discussed for the flowchart of FIG. 6. The method includes an act 600 of asserting a write multiplexer clock signal while a read multiplexer clock signal is asserted during a scan mode of operation. The simultaneous active-low assertion of the read multiplexer clock signal rmp and the active-high assertion of the write multiplexer clock signal uwm by self-timed clock circuit 450 is an example of act 600. The method further includes an act 605 of coupling a scan in signal through a write multiplexer to a first bit line in response to the assertion of the write multiplexer clock signal. The opening of transmission gate T1 in response to the assertion of the write multiplexer clock signal uwm to couple the level-shifted scan in signal sin to the bit line ubl0 is an example of act 605. Finally, the method also includes an act 610 of coupling the scan in signal from the first bit line through a read multiplexer to a global read bit line in response to the assertion of the read multiplexer signal. The coupling of the level-shifted scan in signal sin through read multiplexer and sense amplifier 470 to the global read bit line grbl is an example of act 610.

Figure 7:
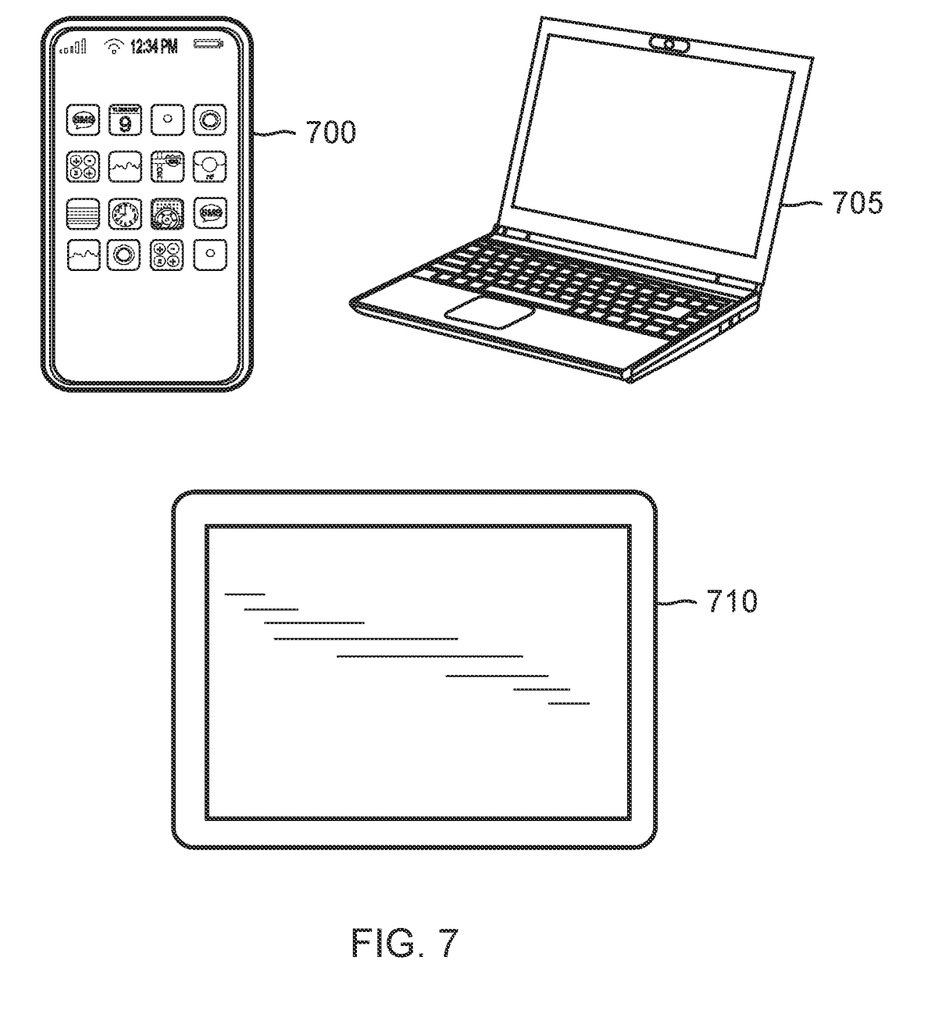
FIG. 7 illustrates some example electronic systems each incorporating pseudo-triple-port memory having a peripheral logic scan capability in accordance with an aspect of the disclosure.

A memory as disclosed herein may be incorporated into a wide variety of electronic systems. For example, as shown in FIG. 7, a cell phone 700, a laptop 705, and a tablet PC 710 may all include a memory having a peripheral logic scan in accordance with the disclosure. Other exemplary electronic systems such as a music player, a video player, a communication device, and a personal computer may also be configured with memories constructed in accordance with the disclosure.

The disclosure will now be summarized by the following example clauses:

Clause 1. A memory, comprising:
a write driver configured to control a binary state of a write driver bit line during a scan mode of operation responsive to a binary state of a scan in signal during a scan mode of operation;
a write multiplexer configured to couple the write driver bit line to a first bit line in response to an assertion of a write multiplexer clock signal;
a read multiplexer configured to couple the first bit line to a global read bit line in response to an assertion of a read multiplexer clock signal; and
a clock circuit configured to assert the write multiplexer clock signal substantially simultaneously with the read multiplexer clock signal during the scan mode of operation.

Clause 2. The memory of clause 1, wherein the clock circuit includes a logic gate configured to assert the write multiplexer clock signal during the scan mode of operation in response to an assertion of the read multiplexer clock signal and a scan mode control signal.

Clause 3. The memory of clause 2, wherein the logic gate comprises a NOR gate.

Clause 4. The memory of any of clauses 1-3, wherein the write driver is further configured to receive a complement scan in signal during the scan mode of operation to control a binary state of a complement write driver bit line.

Clause 5. The memory of clause 4, wherein the write multiplexer is further configured to couple the complement write driver bit line to a first complement bit line in response to the assertion of the write multiplexer clock signal.

Clause 6. The memory of clause 5, wherein the write multiplexer comprises a first transmission gate coupled between the write driver bit line and the first bit line and comprises a second transmission gate coupled between the complement write driver bit line and the first complement bit line.

Clause 7. The memory of any of clauses 5-6, further comprising:
a first bitcell including: a first pair of cross-coupled inverters having an output node for a first bit and a complement output node for a complement of the first bit, a first access transistor coupled between the output node and the first bit line, and a second access transistor coupled between the complement output node and the first complement bit line;

a first word line coupled to a gate of the first access transistor; and a second word line coupled to a gate of the second access transistor, wherein the clock circuit is further configured to control an assertion of the first word line to perform a single-ended read of the first bit through the first bit line during a first portion of a first cycle of a memory clock signal and to assert both the first word line and the second word line during a second portion of the first cycle of the memory clock signal to perform a differential write of a second bit to the first bitcell.

Clause 8. The memory of any of clauses 1-7, wherein the clock circuit is a self-timed clock circuit.

Clause 9. The memory of clause 7, wherein the first access transistor and the second access transistor each comprises an n-type metal-oxide semiconductor (NMOS) transistor.

Clause 10. The memory of clause 7, further comprising:
a second bitcell including a third access transistor coupled between an output node of the second bitcell and the first bit line and including a fourth access transistor coupled between a complement output node of the second bitcell and the first complement bit line;
a third word line coupled to a gate of the third access transistor; and
a fourth word line coupled to a gate of the fourth access transistor, the clock circuit being further configured to control an assertion of the fourth word line during the first portion of the first cycle of the memory clock signal to perform a single-ended read to the second bitcell through the first complement bit line.

Clause 11. The memory of any of clauses 1-10, wherein the read multiplexer further comprises a sense amplifier.

Clause 12. The memory of clause 11, further comprising:
a global read bit line; and
a transistor coupled between the global read bit line and ground, wherein the sense amplifier comprises a NAND gate configured to drive a gate of the transistor.

Clause 13. The memory of clause 12, wherein the transistor is an NMOS transistor having a source coupled to ground and a drain coupled to the global read bit line.

Clause 14. The memory of clause 2, wherein the write driver is further configured to control the binary state of the write driver bit line during the scan mode of operation responsive to a binary state of a bit mask signal.

Clause 15. A scan method for a memory, comprising:
asserting a write multiplexer clock signal while a read multiplexer clock signal is asserted during a scan mode of operation;
coupling a scan in signal through a write multiplexer to a first bit line in response to the assertion of the write multiplexer clock signal; and
coupling the scan in signal from the first bit line through a read multiplexer to a global read bit line in response to the assertion of the read multiplexer signal.

Clause 16. The scan method of clause 15, further comprising:
receiving a memory clock signal edge at a clock circuit, wherein the assertion of the write multiplexer clock signal and the assertion of the read multiplexer clock signal is responsive to the memory clock signal edge.

Clause 17. The scan method of clause 16, wherein the assertion of the write multiplexer clock signal is further responsive to an assertion of a scan mode control signal.

Clause 18. The scan method of any of clauses 15-17, further comprising:
performing a single-ended read through the first bit line to a first bitcell by asserting a first word line in a first pair of word lines for the first bitcell during a first portion of a first memory clock cycle, wherein performing the single-ended read further includes asserting the read multiplexer clock signal while the write multiplexer clock signal is not asserted.

Clause 19. The scan method of clause 18, further comprising:
asserting both the first word line and a second word line in the first pair of word lines to write to the first bitcell through the first bit line and through a first complement bit line during a second portion of the first memory clock cycle, wherein performing the write to the first bitcell further includes asserting the write multiplexer clock signal while the read multiplexer clock signal is not asserted.

Clause 20. A memory, comprising:
a first switch configured to couple a write driver bit line to a first bit line in response to an assertion of a write multiplexer clock signal;
a global read bit line;
a sense amplifier configured to sense a binary state of the first bit line to control a binary state of the global read bit line in response to an assertion of a read multiplexer clock signal; and
a clock circuit configured to assert the write multiplexer clock signal substantially simultaneously with the read multiplexer clock signal during a scan mode of operation.

Clause 21. The memory of clause 20, further comprising:
a first transistor coupled between the global read bit line and ground, and wherein the sense amplifier comprises:
a first logic gate coupled between the first bit line and a gate of the first transistor; and a second transistor coupled between a power supply node for a memory power supply voltage and a power supply node of the first logic gate, wherein the second transistor is configured to switch on in response to an assertion of a read multiplexer clock signal.

Clause 22. The memory of clause 21, wherein the first logic gate comprises a NAND gate.

Clause 23. The memory of clause 21, wherein the first transistor comprises an NMOS transistor, and wherein the second transistor comprises a PMOS transistor.

Clause 24. The memory of any of clause 20-23, wherein the first switch comprises a first transmission gate.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:
1. A memory, comprising:
a write driver configured to control a binary state of a write driver bit line during a scan mode of operation responsive to a binary state of a scan in signal during a scan mode of operation;
a write multiplexer configured to couple the write driver bit line to a first bit line in response to an assertion of a write multiplexer clock signal;
a read multiplexer configured to couple the first bit line to a global read bit line in response to an assertion of a read multiplexer clock signal; and a clock circuit configured to assert the write multiplexer clock signal substantially simultaneously with the read multiplexer clock signal during the scan mode of operation.

2. The memory of claim 1, wherein the clock circuit includes a logic gate configured to assert the write multiplexer clock signal during the scan mode of operation in response to an assertion of the read multiplexer clock signal and a scan mode control signal.

3. The memory of claim 2, wherein the logic gate comprises a NOR gate.

4. The memory of claim 2, wherein the write driver is further configured to control the binary state of the write driver bit line during the scan mode of operation responsive to a binary state of a bit mask signal.

5. The memory of claim 1, wherein the write driver is further configured to receive a complement scan in signal during the scan mode of operation to control a binary state of a complement write driver bit line.

6. The memory of claim 5, wherein the write multiplexer is further configured to couple the complement write driver bit line to a first complement bit line in response to the assertion of the write multiplexer clock signal.

7. The memory of claim 6, wherein the write multiplexer comprises a first transmission gate coupled between the write driver bit line and the first bit line and comprises a second transmission gate coupled between the complement write driver bit line and the first complement bit line.

8. The memory of claim 6, further comprising:
a first bitcell including: a first pair of cross-coupled inverters having an output node for a first bit and a complement output node for a complement of the first bit, a first access transistor coupled between the output node and the first bit line, and a second access transistor coupled between the complement output node and the first complement bit line;
a first word line coupled to a gate of the first access transistor; and
a second word line coupled to a gate of the second access transistor, wherein the clock circuit is further configured to control an assertion of the first word line to perform a single-ended read of the first bit through the first bit line during a first portion of a first cycle of a memory clock signal and to assert both the first word line and the second word line during a second portion of the first cycle of the memory clock signal to perform a differential write of a second bit to the first bitcell.

9. The memory of claim 8, wherein the first access transistor and the second access transistor each comprises an n-type metal-oxide semiconductor (NMOS) transistor.

10. The memory of claim 8, further comprising:
a second bitcell including a third access transistor coupled between an output node of the second bitcell and the first bit line and including a fourth access transistor coupled between a complement output node of the second bitcell and the first complement bit line;
a third word line coupled to a gate of the third access transistor; and
a fourth word line coupled to a gate of the fourth access transistor, the clock circuit being further configured to control an assertion of the fourth word line during the first portion of the first cycle of the memory clock signal to perform a single-ended read to the second bitcell through the first complement bit line.

11. The memory of claim 1, wherein the clock circuit is a self-timed clock circuit.

12. The memory of claim 1, wherein the read multiplexer further comprises a sense amplifier.

13. The memory of claim 12, further comprising:
a global read bit line; and
a transistor coupled between the global read bit line and ground, wherein the sense amplifier comprises a NAND gate configured to drive a gate of the transistor.

14. The memory of claim 13, wherein the transistor is an NMOS transistor having a source coupled to ground and a drain coupled to the global read bit line.

15. A scan method for a memory, comprising:
asserting a write multiplexer clock signal while a read multiplexer clock signal is asserted during a scan mode of operation;
coupling a scan in signal through a write multiplexer to a first bit line in response to the assertion of the write multiplexer clock signal; and
coupling the scan in signal from the first bit line through a read multiplexer to a global read bit line in response to the assertion of the read multiplexer clock signal.

16. The scan method of claim 15, further comprising:
receiving a memory clock signal edge at a clock circuit, wherein the assertion of the write multiplexer clock signal and the assertion of the read multiplexer clock signal is responsive to the memory clock signal edge.

17. The scan method of claim 16, wherein the assertion of the write multiplexer clock signal is further responsive to an assertion of a scan mode control signal.

18. The scan method of claim 15, further comprising:
performing a single-ended read through the first bit line to a first bitcell by asserting a first word line in a first pair of word lines for the first bitcell during a first portion of a first memory clock cycle, wherein performing the single-ended read further includes asserting the read multiplexer clock signal while the write multiplexer clock signal is not asserted.

19. The scan method of claim 18, further comprising:
asserting both the first word line and a second word line in the first pair of word lines to write to the first bitcell through the first bit line and through a first complement bit line during a second portion of the first memory clock cycle, wherein performing the write to the first bitcell further includes asserting the write multiplexer clock signal while the read multiplexer clock signal is not asserted.

20. A memory, comprising:
a first switch configured to couple a write driver bit line to a first bit line in response to an assertion of a write multiplexer clock signal;
a global read bit line;
a sense amplifier configured to sense a binary state of the first bit line to control a binary state of the global read bit line in response to an assertion of a read multiplexer clock signal; and
a clock circuit configured to assert the write multiplexer clock signal substantially simultaneously with the read multiplexer clock signal during a scan mode of operation.

21. The memory of claim 20, further comprising:
a first transistor coupled between the global read bit line and ground, and wherein the sense amplifier comprises:
a first logic gate coupled between the first bit line and a gate of the first transistor; and a second transistor coupled between a power supply node for a memory power supply voltage and a power supply node of the first logic gate, wherein the second transistor is configured to switch on in response to an assertion of the read multiplexer clock signal.

22. The memory of claim 21, wherein the first logic gate comprises a NAND gate.

23. The memory of claim 21, wherein the first transistor comprises an NMOS transistor, and wherein the second transistor comprises a PMOS transistor.

24. The memory of claim 20, wherein the first switch comprises a first transmission gate.

* * * * *